United States Patent [19]

Tihanyi

[11] Patent Number: 4,626,886

[45] Date of Patent: Dec. 2, 1986

[54] POWER TRANSISTOR

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 631,288

[22] Filed: Jul. 16, 1984

[30] Foreign Application Priority Data

Aug. 12, 1983 [DE] Fed. Rep. of Germany ....... 3329241

[51] Int. Cl.$^4$ .................... H01L 29/72; H01L 27/02; H01L 23/48
[52] U.S. Cl. ........................................ 357/34; 357/36; 357/51; 357/68
[58] Field of Search .................... 357/34, 51, 68, 36

[56] References Cited

U.S. PATENT DOCUMENTS

| 3,462,658 | 8/1969 | Worchel et al. | |
| 3,868,720 | 2/1975 | New et al. | |
| 3,943,546 | 3/1976 | Kaiser | 357/34 |
| 4,017,882 | 4/1977 | Kannam et al. | 357/34 |
| 4,151,542 | 4/1979 | Yajima et al. | |
| 4,411,708 | 10/1983 | Winhan | 357/51 |
| 4,511,912 | 4/1985 | Mahrla | 357/34 |

OTHER PUBLICATIONS

Electronic Engineering, Jul. 1983, pp. 78–79, FIG. 15.

Primary Examiner—Martin H. Edlow
Assistant Examiner—Terri M. Henn
Attorney, Agent, or Firm—John Francis Moran

[57] ABSTRACT

The invention relates to a power transistor with a semiconductor body. When shutting off a power transistor, local fusing of the semiconductor body may occur, if a characteristic power loss is exceeded for a certain period of time (second breakdown). This can be avoided, if the transistor includes a multiplicity of small partial transistors with very narrow emitter zones which are mutually paralleled via a ballast resistance each.

7 Claims, 4 Drawing Figures

POWER TRANSISTOR

BACKGROUND OF THE INVENTION

This invention relates to power transistors with semiconductor bodies.

When shutting off a power transistor, local fusing of the semiconductor body and resulting destruction of the transistor can occur, if the permissible operating range of the transistor is exceeded. This permissible operating range is characterized by a maximally permissible characteristic switching power loss which must not be exceeded in the semiconductor body for a certain period of time. The maximally permissible power becomes lower, the longer it is converted to heat in the semiconductor body. The reason for the local fusing when the permissible operating range is exceeded presumably is that, in shutting off the transistor, the current setting in and flowing laterally under the emitter biases the blocked emitter-base-pn-junction in the forward direction so that a high current can flow at simultaneously rising base-collector voltage. These difficulties have been overcome in the past by designing power transistors with fingershaped emitter zones in which the lateral resistance below the emitter zone is reduced in accordance with the narrower width of the fingers. Accordingly, the permissible operating range of such a transistor is greater when compared to a transistor of the same, but contiguous area.

Another known solution to overcome these problems consists of dividing a power transistor into a multiplicity of partial transistors integrated on a single semiconductor body and connected to a common emitter electrode via a ballast resistor. Such a solution is described, for instance, in the journal "Electronic Engineering", July 1983, pages 78–79, FIG. 15. The emitter zones of each partial transistor are embedded in a base zone common to all partial transistors. The ballast resistor of each partial transistor is formed by a zone of opposite conduction type embedded in the emitter zone. While this avoids direct contact between ballast resistor and the base zone, the lateral dimensions of the emitter zone cannot fall below a certain size, however. Therefore, a strong current flowing laterally under the emitter zone can bias the base-emitter-pn-junction positively, and the pn-junction starts emitting.

Accordingly, the invention relates to a power transistor with a semiconductor body containing at least one base zone, at least one collector zone and a multiplicity of emitter zones connected to an emitter electrode via a resistor each.

SUMMARY OF THE INVENTION

The object of the invention is to provide a power transistor with an increased or larger permissible operating range.

In general, the invention features a power transistor with a semiconductor body, including at least one base zone, at least one collector zone and a plurality of emitter zones connected to an emitter electrode via a resistor, wherein the emitter zones are designed as strips, the resistances each comprise at least a part of a layer, this layer is disposed on an insulating layer located on top of the semiconductor body and contacts the coordinated emitter zone through at least one contact hole provided in the insulating layer.

In preferred embodiments of the power transistor the emitter zones are formed by one straight strip each; the emitter zones are formed by a strip formed into a ring; the emitter zones are each formed by a strip formed into a polygon; the layer disposed on the insulating layer covers at least a part of the semiconductor body surface located within the ring; the layer disposed on the insulating layer covers at least a part of the semiconductor body located within the polygon; each two of the strips are contacted by a layer disposed on the insulating layer and the layer covers at least a part of the semiconductor body surface located between the two strips; the layer disposed on the insulating layer comprises doped semiconductor material; the semiconductor material is polycrystalline silicon; base contact zones doped higher than the doping of the base zone are embedded in the base zone; one each of the base contact zones is disposed between two of the emitter zones, the layer disposed on the insulating layer projects outwardly beyond the emitter zone, and it serves as implantation mask for the base contact zones; and the semiconductor layer disposed on the insulating layer is doped higher than the emitter zone in contact with it, and it serves as a doping material source for this emitter zone.

Other features and advantages of the present invention will become apparent from the following detailed description and from the claims.

For a full understanding of the present invention, reference should now be made to the following detailed description and to the accompanying drawings.

DETAILED DESCRIPTION

Figure 1:
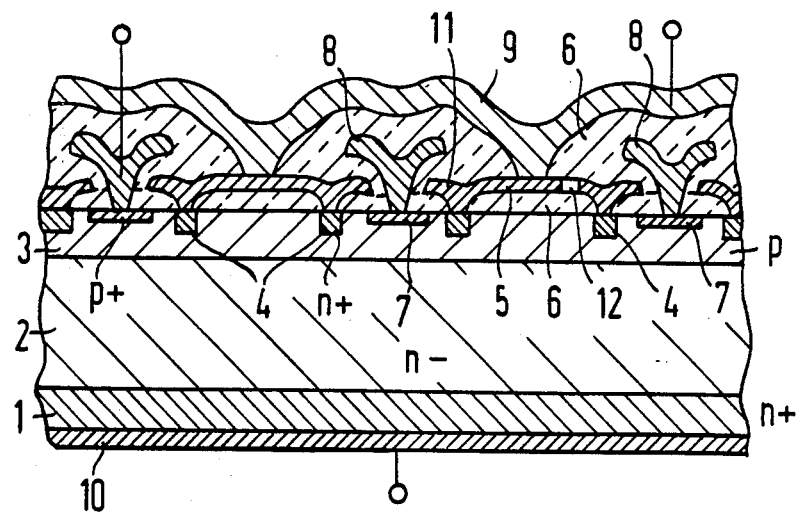
FIG. 1 is a cross-sectional view of a preferred embodiment of the power transistor.
Figure 3:
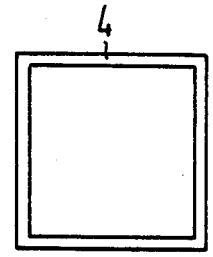
FIG. 3 is a top view of a second embodiment of the emitter zone.
Figure 4:
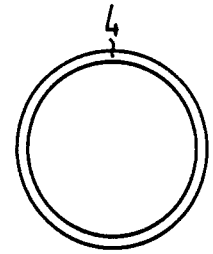
FIG. 4 is a top view of a third embodiment of the emitter zones of the power transistor.

The power transistor shown in FIG. 1 has a highly n-doped substrate 1. On it sits a weakly n-doped collector zone 2, applied for example by epitaxial deposition. Located above the collector zone is a base zone 3 which is p-doped. Planar emitter zones 4 are embedded in base zone 3. Emitter zones 4 are stripshaped so that their width is much smaller than their length. For instance, they may be ten times longer than wide, but it is also possible to make the length-to-width ratio greater than 100. The strips forming the emitter zones may be straight (see FIG. 2), they may form a polygon such as a rectangle (see FIG. 3), a hexagon, an octagon or also a ring of circular section (see FIG. 4). Both the polygon and the ring may be open or closed. A preferred embodiment of the emitter zone is the ring shown to FIG. 4, because it results in uniform field strength distribution along the circumference. Therefore, the embodiment shown in FIG. 1 will now be described for a ringshaped emitter zone.

Each one of the ringshaped emitter zones 4 is covered, at least in part, by a layer 5 which forms the partial transistor ballast resistance mentioned above. This layer preferably is a doped semiconductor layer, but may also be a metal layer. Semiconductor layer 5 is disposed on a partial layer of insulating layer 6, defined by the horizontal, broken lines. Each semiconductor layer 5 is connected to coordinated emitter zone 4 through at least one contact window provided in the partial layer of insulating layer 6. But it may also be in contact with emitter zone 4 over its entire periphery. In turn, all semiconductor layers 5 are electrically connected to an emitter electrode 9. The individual partial transistors are mutually paralleled by emitter electrode 9. Embedded in base zone 3 between the partial transistors are base contact zones 7. They are higher doped than base zone 3. The base contact zones are contacted by base contacts 8 which are mutually paralleled. They preferably form a coherent grid located under emitter electrode 9. The other side of the semiconductor body formed by substrate 1 is provided with collector electrode 10.

The stripshaped emitter zones 4 can be kept extremely narrow. Their width is preferably between 5 and 10 μm. On the other hand, the diameter of the partial transistor of the emitter cell may be between 50 and 100 μm, for example. In the embodiment shown, semiconductor layer 5 forming the ballast resistance consists of n-doped, polycrystalline silicon between 0.2 and 1 μm thick. The layer resistance of the polycrystalline silicon is between 10 and 150 Ohms/□, a value of about 50 Ohms/□ being preferred. The semiconductor layer 5 is expediently doped so high as to show a positive resistance temperature coefficient. This causes the resistance to increase to such an extent in case of a possibly beginning overload of a transistor cell that a negative feedback sets in which reduces the bias current and thus causes less emitter current to flow.

The semiconductor layer 5 may also consist of other semiconductor materials such as germanium, $A_3B_5$ compounds, etc. A semiconductor layer 5 consisting of silicon can preferably be used as implantation mask for the base contact zones 7, if the semiconductor layer 5 projects beyond the edge of ringshaped emitter zone 4, forming overhand 11. It is then easy to produce emitter contact zones 7, for example by implanting boron ions. To produce an emitter contact zone of a depth between 0.1 and 1.5 μm, the dose is 0.1 to $10 \times 10^{15}/cm^2$ and the energy 10 to 200 keV.

It is particularly favorable to produce emitter zones 4 by first applying to base zone 3 an insulating layer 6 up to the broken horizontal line. Then contact holes are etched out of the surface of emitter zone 4 in the places where the emitter zones are to be located. Subsequently, a polycrystalline silicon layer is deposited which is doped higher than the doping of the emitter zones to be produced. Semiconductor layer 5 then serves as the doping material source for emitter zone 4, atoms of the doping material diffusing during a conventional heat treatment from semiconductor layer 5 in the area of the contact windows mentioned into base zone 3, in a depth of 0.5 to 5 μm for example.

Due to the location of semiconductor layer 5 on insulating layer 6, (for example outside of the semiconductor body) it is possible to make the emitter zones very narrow. It is possible in addition to balance the resistances of semiconductor layers 4 in a simple manner, such as by providing a hole 12 in one of the semiconductor layers 5, should the resistance of this particular semiconductor layer be too low. Also, the doping of the semiconductor body zones may be complementary. If semiconductor layers 5 are to serve as a doping material source for the emitter zones, they should then be doped with boron, for example.

Figure 2:
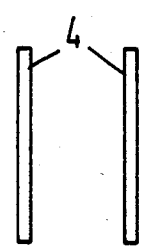
FIG. 2 is a top view of a first embodiment of the emitter zone.

If the emitter zones are formed by the strips according to FIG. 2, it is expedient to contact two adjacent strips by a single layer 5 each. Layer 5 then covers at least a part of the surface of base zone 3 located between the two strips.

There has thus been shown and described a novel power transistor which fulfills all objects and advantages sought thereof. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

What is claimed is:

1. A power transistor having a semiconductor body, including at least one base zone, at least one collector zone and a plurality of emitter zones connected to an emitter electrode via a resistor each, the power transistor comprising each emitter zone being in the shape of a strip, each resistor comprising at least a portion of a first layer, the first layer being disposed on an insulating layer located on top of the semiconductor body and contacting each coordinated emitter zone through at least one aperture provided in the insulating layer wherein the first layer disposed on the insulating layer comprises doped semiconductor material of polycrystalline silicon, each of the at least one base zone including a base contact zone doped higher than the doping of the base zone and embedded in the base zone, each base contact zone being disposed between two of the emitter zones, the layer disposed on the insulating layer projecting outwardly beyond the emitter zone and being an implantation mask for the base contact zones, and the semiconductor layer disposed on the insulating layer being doped higher than the emitter zone in contact with it and being a source of doping material for the emitter zone.

2. The power transistor of claim 1, wherein the emitter zones are formed by one straight strip each.

3. The power transistor of claim 1, wherein the emitter zones are each formed by a strip formed into a ring.

4. The power transistor of claim 1, wherein the emitter zones are each formed by a strip formed into a polygon.

5. The power transistor of claim 3, wherein the first layer disposed on the insulating layer covers at least a part of the semiconductor body surface located within the ring.

6. The power transistor of claim 4, wherein the first layer disposed on the insulating layer covers at least a part of the semiconductor body surface located within the polygon.

7. The power transistor of claim 2, wherein each two of the strips are contacted by the first layer disposed on the insulating layer and the layer covers at least a part of the semiconductor body surface located between the two strips.

* * * * *